United States Patent [19]

Sulzbach et al.

[11] 3,996,461

[45] Dec. 7, 1976

[54] SILICON PHOTOSENSOR WITH OPTICAL THIN FILM FILTER

[75] Inventors: Frank C. Sulzbach, Dallas; Joseph B. Horak, Richardson, both of Tex.

[73] Assignee: Texas Instruments Incorporated, Dallas, Tex.

[22] Filed: Mar. 31, 1975

[21] Appl. No.: 563,934

[52] U.S. Cl. ............... 250/211 J; 350/166; 357/30

[51] Int. Cl.² ....................... H01J 39/12

[58] Field of Search .......... 357/29, 30, 31; 250/211 R, 211 J; 350/166; 117/33.3

[56] References Cited

UNITED STATES PATENTS

| 3,247,392 | 4/1966  | Thelan ............... 357/30   |
| 3,348,074 | 10/1967 | Diemer ............ 250/211 J   |
| 3,528,726 | 9/1970  | Austin ............... 350/166  |
| 3,649,359 | 3/1972  | Apfel et al. ......... 350/166  |
| 3,697,153 | 10/1972 | Zycha ................ 350/166  |
| 3,759,604 | 9/1973  | Thelan ............... 350/166  |
| 3,781,090 | 12/1973 | Sumita ............... 350/166  |

*Primary Examiner*—David C. Nelms
*Attorney, Agent, or Firm*—Harold Levine; James T. Comfort; Gary C. Honeycutt

[57] ABSTRACT

Disclosed is silicon photodiode having a multilayer thin film optical filter deposited directly on the detecting surface thereof. The multilayer filter is an interference type filter designed to limit the normal response of a silicon photodiode so that its spectral response is essentially the same as that of the human eye. The multilayer filter is applied to the diode during fabrication using low cost mass production techniques. The multilayer filter materials are very durable and provide excellent passivation and environmental protection for the diode surface.

7 Claims, 3 Drawing Figures

SILICON PHOTOSENSOR WITH OPTICAL THIN FILM FILTER

This invention is related to semiconductor photosensors and more particularly to semicobnductor photosensors having integral optical filters for shaping the photosensor spectral response and to methods for their fabrication.

Silicon photosensors are presently being used in many applications where cadmium sulfide cells were previously used. One reason for this is the faster response time of the silicon photosensors which allows their use in fully automatic cameras. The simple silicon photodiode typically used is produced at low cost on modern, efficient, high capacity semiconductor production lines. Much of the advantage achieved by use of these efficient production lines is lost when the silicon photodiode must be tailored to a particular spectral response curve such as the human eye response.

A desired spectral response is typically achieved by fabricating an optical filter which is mounted in or attached to the diode package and absorbs unwanted light wavelengths. In camera applications, the filter is basically an infrared absorbing filter which compensates for the high infrared response of the detector. Such bulk filter materials often have poor stability under high humidity conditions and must either have their own protective window or be carefully mounted in a unit which will protect the filter. The labor cost involved in the fabrication and assembly of such individual filters may often exceed all other costs of fabricating a silicon photodetector.

Accordingly, an object of the present invention is to provide an improved semiconductor photosensor.

Another object of the present invention is to provide a semiconductor photosensor having an integral optical filter for shaping the detector's spectral response.

Another object of the present invention is to provide a semiconductor photosensor which may be mounted in a nonhermetic package.

Another object of the present invention is to provide a low cost semiconductor photosensor.

These and other objects of the present invention are achieved by providing a semiconductor photosensor having a multilayer thin film optical filter deposited upon a detecting surface thereof.

Other objects, features and advantages of this invention will become better understood by reference to the following detailed description when read in conjunction with the accompanying drawings wherein.

Figure 1:
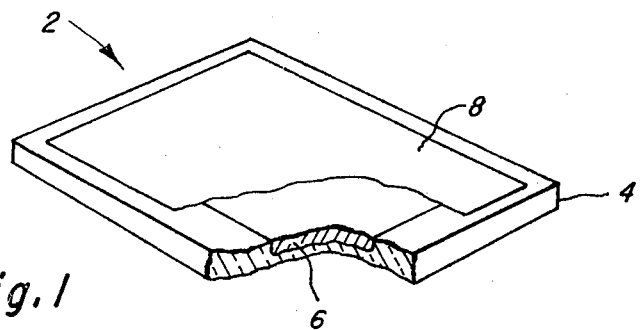
FIG. 1 is an illustration of a silicon photodiode having a multilayer filter comprising an embodiment of the present invention.

FIG. 1 is a partially broken away illustration of a silicon photodiode shown generally at 2 embodying the present invention. The photodiode 2 includes, for example, an n-type silicon substrate 4 having a p-type region 6 on the top surface thereof. The basic photodiode having a silicon nitride passivation and anti-reflection coating deposited over the region 6 is a standard production item produced by Texas Instruments Incorporated under Part No. TI-LS849. In the preferred embodiment, a filter 8 is deposited over region 6. Filter 8 is a thin film multilayer optical filter for limiting the response of the standard photodiode so that it corresponds to the human eye response. Filter 8 comprises thirty-seven thin film layers, one of which is the silicon nitride coating of the standard photodiode. The optical effects of the silicon nitride layer are modified by the further layers deposited upon it whereby it becomes a part of the multilayer filter.

Figure 2:
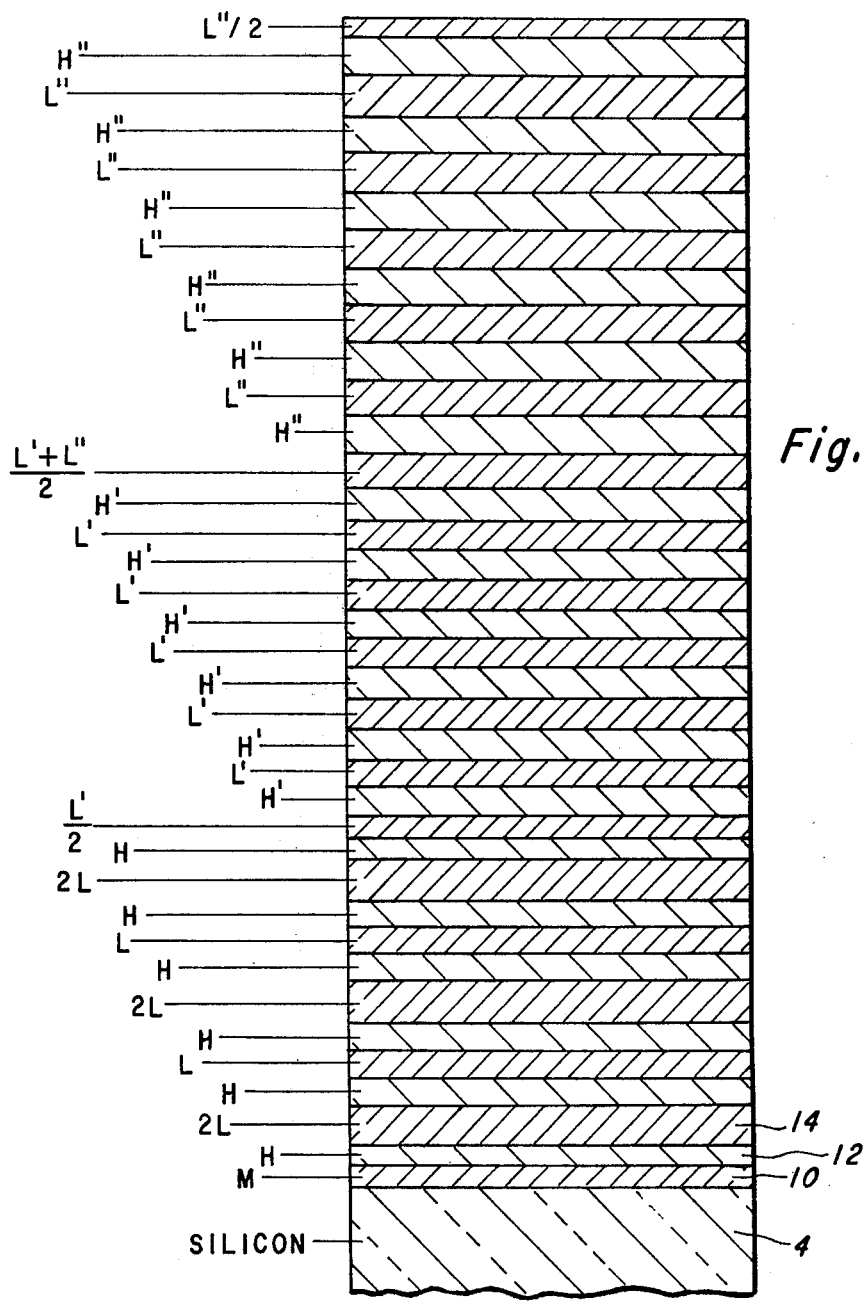
FIG. 2 is a cross-section of the optical filter of FIG. 1 with the thicknesses of the layers greatly exaggerated.

FIG. 2 is a cross-sectional view of the photodetector 2 of FIG. 1 illustrating a portion of the silicon substrate 4 and each of the layers comprising filter 8 of FIG. 1. The thickness of each of the layers are greatly exaggerated for purposes of illustration, but the relative thicknesses of the layers are correctly illustrated. A first layer 10 of silicon nitride, $Si_2N_3$, is in direct contact with the silicon substrate 4. A second layer 12 of titanium oxide, $TiO_2$, overlays the first layer 10. A third layer 14 of silicon oxide, $SiO_2$, overlays the second layer 12. The remaining thirty-four layers are alternately titanium oxide and silicon oxide. The multilayer filter design is more accurately stated in the following shorthand notation:

Silicon M H2LH L H2LH L H2LH $$\left(\frac{L'}{2} H' \frac{L'}{2}\right)^6 \left(\frac{L''}{2} H'' \frac{L''}{2}\right)^6$$

Air where M, H, L, H', L', H'' L'' are quarter wave length optical thicknesses, that is:

$H = \frac{\lambda}{4}$ of index 2.35 at $\lambda = 550$ nm $H' = \frac{\lambda}{4}$ of index 2.35 at $\lambda = 780$ nm $H'' = \frac{\lambda}{4}$ of index 2.35 at $\lambda = 1000$ nm $M = \frac{\lambda}{4}$ of index 2.0 at $\lambda = 550$ nm $L = \frac{\lambda}{4}$ of index 1.46 at $\lambda = 550$ nm $L' = \frac{\lambda}{4}$ of index 1.46 at $\lambda = 780$ nm $L'' = \frac{\lambda}{4}$ of index 1.46 at $\lambda = 1000$ nm and $M = Si_2N_3$, $H = H' = H'' = TiO_2$, $L = L' = L'' = SiO_2$.

This multilayer filter notation is further explained and illustrated in the Military Standardization Handbook on Optical Design (MIL-HDBK-141) published by the U.S. Department of Defense, Defense Supply Agency on Oct. 5, 1962. Reference may also be had to Chapters 20 and 21 of this handbook for a detailed statement of the theory and applications of mulitlayer optical coatings.

Although silicon dioxide with an index of 1.46 was used for the low index material designated L in the above optical filter design any suitable material having an index less than 1.5 will also give the desired response. A large number of materials, notably the metal fluorides, are suitable for use as low index materials. Likewise, several other materials having a refractive index near 2.35 may be used in place of titanium oxide as the high index material. Thus, other metal oxides and several metal sulfides and metal selenides may be used in place of titanium oxide.

Multilayer filters normally comprise only dielectric materials. Filter action results from interference between the various incident and reflected waves and essentially no energy is absorbed by the filter materials. The lack of absorption is the main functional difference between a multilayer filter and a bulk type of filter which functions solely by absorption. It is apparent that some dielectric materials suitable for use in multilayer filters may also absorb certain wavelengths of light. In some applications it is desirable to use such absorption materials to provide additional filtering action. Thus, although the filter of the preferred embodiment comprises only nonabsorbing materials, this is not intended as a limitation.

In the preferred embodiment, the layers of titanium oxide were deposited by electron beam bombardment and the layers of silicon oxide by thermal evaporation of silicon monoxide in $O_2$ atmosphere. It is apparent that these materials may be deposited by any of the standard thin film deposition techniques such as thermal evaporation, electron beam bombardment, sputtering, chemical vapor deposition, reactive plasma deposition, chemical solution and induction heating.

The first filter layer of silicon nitride was deposited in a reactive plasma deposition system. It is expected that a more reliable filter will result from deposition of all the layers by reactive plasma deposition without removing the diodes from the chamber after the silicon nitride is deposited. Such a continuous deposition process would have the inherent advantage of preventing contamination of the silicon nitride layer upon exposure to air which may reduce the adhesion of the next filter layer. Additionally the electron beam deposition process used in the preferred embodiment generates x-rays which cause minor damage to the photodiode and increase the leakage current. In the preferred embodiment this damage is substantially eliminated by annealing the diodes at 400° C for one hour after the filter deposition process. A reactive plasma deposition process will totally eliminate the damage as well as eliminating the need for the annealing step.

Figure 3:
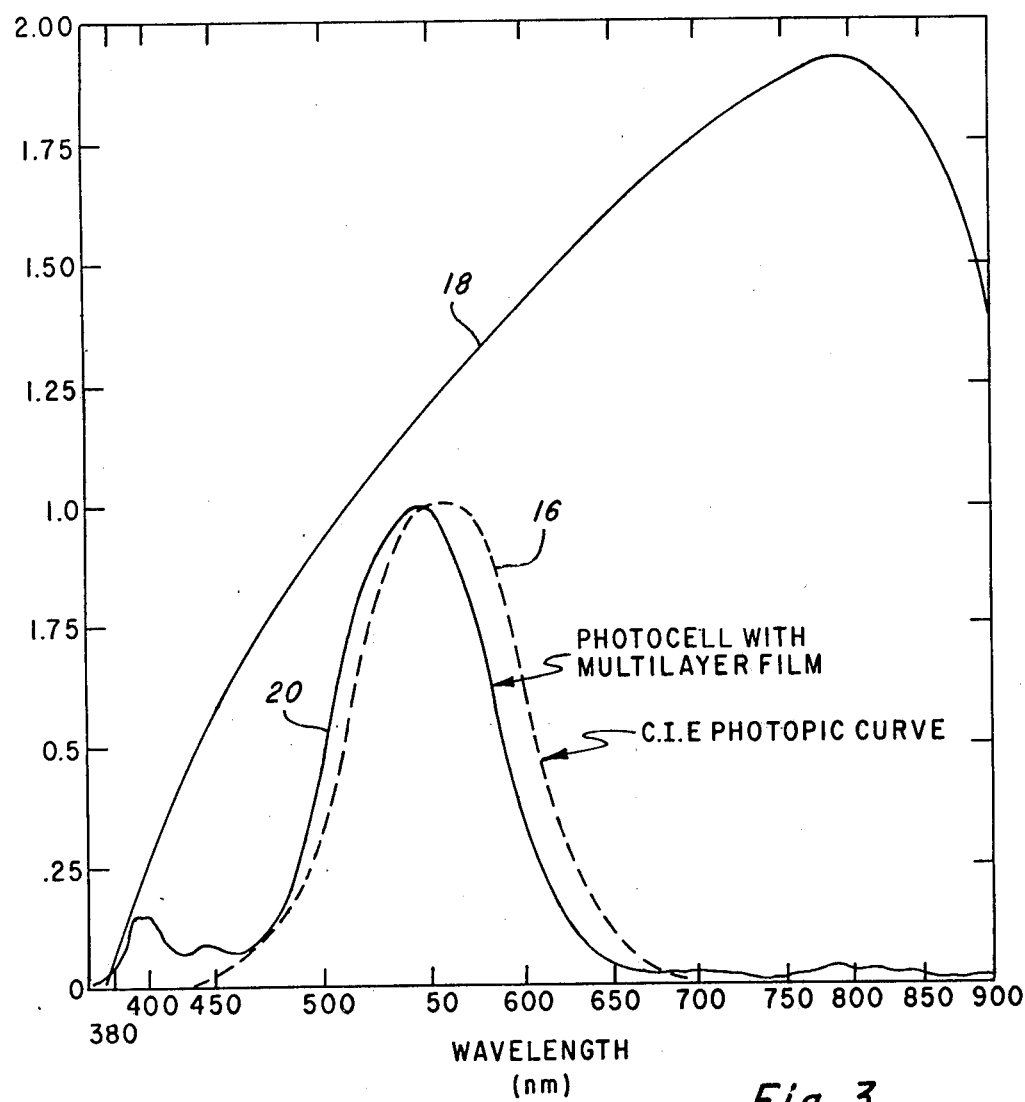
FIG. 3 is a graph showing the transmittance characteristics of the photodiode of FIG. 1 with and without the optical filter and a curve showing the response of the human eye for comparison purposes.

FIG. 3 is a graphical comparison of the optical response of the photodiode 2 of FIG. 1 with and without the optical filter 8. A dotted line curve 16 illustrates the CIE photopic curve for comparison purposes. Curve 16 is more commonly known as the human eye response curve and its peak point is designated one on the relative response scale. A curve 18 illustrates the response of the basic silicon photodiode without any optical filter. Curve 18 shows that the diode has very large response in the infrared region and that its response exceeds the human eye response curve 16 at all wavelengths. Filter 8 of FIG. 1 is designed so that it will reduce light reaching the photodiode so that the resulting diode response approximates human eye response curve 16. A curve 20 illustrates the actual test results of the preferred embodiment photodiode. Electrical contact to the p-type region of the diode 2 was provided by etching a small portion of the filter 8 to expose pads for bond contacts. This was accomplished by ultrasonic etching in a buffered HP solution. Curve 20 closely approximates curve 16, and the small difference between the peaks of the two curves 20 and 16 is believed to be due to errors in thickness of several filter layers of this initial test device.

It is apparent that a semiconductor photosensor according to the present invention costs only slightly more to produce than a basic photosensor without an optical filter. As an example, the preferred embodiment photodiode is produced on silicon slices containing approximately 300 detectors per slice. At least 50 of these slices may be coated in a single deposition system capable of depositing the above described multilayer optical filter in one work shift. The preferred embodiment photodiode eliminates the need for a separate bulk type filter and may be packaged in an inexpensive molded clear plastic package. Alternatively, the photodiode may be mounted on a standard header or the surface of a printed circuit board without any protective covering.

It is apparent that this invention applies equally well to other semiconductor photosensors. For example, charge coupled device imaging arrays are presently being developed for various TV applications. An example is disclosed in U.S. Pat. No. 3,887,810, by F. L. Skaggs for "Photon-Multiplier Imaging System" and assigned to the assignee of the present invention. A multilayer optical filter similar to that described above may be placed on the detecting surface of such an array to cause the array to have a spectral response similar to that of the human eye. Other similar filters may be used to cause such an array to respond to one or more color bands for color TV applications.

Although the present invention has been shown and illustrated in terms of a specific device utilizing a *p* on *n* type material, it will be apparent that if desired for certain applications an *n* on *p* type material can be used and that other changes or modifications can be made without departing from the spirit and scope of the invention as defined by the appended claims.

What is claimed is:

1. A photodetector comprising a semiconductor substrate having a photosensitive region therein and a multilayer thin film optical filter on a surface of said substrate covering said photosensitive region, said filter comprising a first thin film of dielectric having an index of refraction of about 2.0, a second thin film of dielectric on said first film having an index of refraction of about 2.35, a third thin film of dielectric on said second film having an index of refraction of less than about 1.5, and a plurality of additional thin films thereon, corresponding alternately to the index of said second and third thin films, respectively.

2. A photodetector according to claim 1 wherein the substrate is silicon.

3. A photodetector according to claim 2 wherein the photosensitive region is a *p-n* junction within the substrate.

4. A photodetector according to claim 1 wherein the first, second and third dielectrics are $Si_2N_3$, $TiO_2$, and $SiO_2$, respectively.

5. A photodetector comprising a semiconductor substrate having a multilayer thin film optical filter comprising layers of dielectric materials stacked on a surface of said semiconductor substrate in the following order:

a. a $\lambda_1/4$ layer of a first dielectric having a first index of refraction;
   b. a first three layer system comprising a $\lambda_1/4$ layer of a second dielectric having a higher index of refraction than said first dielectric, a $\lambda_1/4$ layer of a third dielectric having a lower index of refraction than said first dielectric and a $\lambda_1/4$ layer of said second dielectric;

c. a $\lambda_1/4$ layer of said third dielectric;
d. a second three layer system identical to said first three layer system;
e. a $\lambda_1/4$ layer of said third dielectric;
f. a third three layer system identical to said first three layer system;
g. fourth through ninth three layer systems each comprising a $\lambda_2/8$ layer of said third dielectric, a $\lambda_2/4$ layer of said second dielectric, and a $\lambda_2/8$ layer of said third dielectric; and
h. tenth through fifteenth three layer systems each comprising a $\lambda_3/8$ layer of said third dielectric, a $\lambda_3/4$ layer of said second dielectric, and a $\lambda_3/8$ layer of said third dielectric, where $\lambda_1$ is 550 nanometers, $\lambda_2$ is 780 nanometers and $\lambda_3$ is 100 nanometers.

6. A photodetector according to claim 5 wherein the index of refraction of said third dielectric is substantially equal to 1.46, the index of refraction of said first dielectric is substantially equal to 2.0, and the index of refraction of said second dielectric is substantially equal to 2.35.

7. A photodetector according to claim 5 wherein said third dielectric is $SiO_2$, said first dielectric is $Si_2N_3$, and said second dielectric is $TiO_2$.

* * * * *